(12) United States Patent
Yang et al.

(10) Patent No.: US 6,774,697 B2
(45) Date of Patent: Aug. 10, 2004

(54) INPUT AND OUTPUT PORT CIRCUIT

(75) Inventors: Yil Suk Yang, Daejon-Shi (KR); Jong Dae Kim, Daejon-Shi (KR); Tae Moon Roh, Daejon-Shi (KR); Jin Gun Koo, Daejon-Shi (KR); Dae Woo Lee, Daejon-Shi (KR); Sang Gi Kim, Daejon-Shi (KR); Il Yong Park, Kyeonggi-Do (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/325,929

(22) Filed: Dec. 23, 2002

(65) Prior Publication Data

US 2004/0041597 A1 Mar. 4, 2004

(30) Foreign Application Priority Data

Aug. 28, 2002 (KR) ........................................ 2002-51029

(51) Int. Cl.[7] .............................................. H03L 5/00
(52) U.S. Cl. ...................................... 327/333; 327/112
(58) Field of Search ..................... 326/58, 86; 327/333, 327/27

(56) References Cited

U.S. PATENT DOCUMENTS

| | | | |
|---|---|---|---|
| 5,821,800 A | 10/1998 | Le et al. ...................... 327/333 |
| 6,225,824 B1 * | 5/2001 | Madhu et al. ................. 326/58 |
| 6,240,030 B1 * | 5/2001 | Kang et al. .................. 365/201 |
| 6,323,704 B1 | 11/2001 | Pelley et al. ................. 327/112 |
| 6,512,401 B2 * | 1/2003 | Clark et al. .................. 327/333 |

FOREIGN PATENT DOCUMENTS

WO   WO 01/18967   3/2001

* cited by examiner

*Primary Examiner*—Dinh T. Le
(74) *Attorney, Agent, or Firm*—Jacobson Holman PLLC

(57) ABSTRACT

The present invention relates to an input and output port circuit. The input and output port circuit comprises a signal register for storing output signals, an input/output register at which an input/output control signal for determining an input/output direction is stored, a plurality of control registers, a power supply switch circuit for selectively supplying a low voltage or a high voltage depending on a power mode control signal, a signal direction control circuit for determining the direction of the signal depending on a value of the signal register and a value of the input/output register, an output control circuit driven depending on the value of the control register and an output of the signal direction control circuit, and an output driving circuit for outputting the low voltage, the high voltage or the ground value depending on an output of the signal direction control circuit and an output of the output control circuit. The high voltage and the low voltage can be simultaneously driven using only a single output driving circuit and the single output driving circuit is constructed in multiple stages and is selectively driven by the output control register. Therefore, the power consumption can be saved.

9 Claims, 6 Drawing Sheets

INPUT AND OUTPUT PORT CIRCUIT

BACKGROUND OF THE INVENTION

1. Field of the Invention

The invention relates generally to an input and output port circuit. More particularly, the invention relates to an input and output port circuit by which an output driving circuit can be simultaneously driven at a high voltage operation mode and a low voltage operation mode and the output driving circuit can be also selectively driven since they are also constructed in a multiple stage.

2. Description of the Prior Art

An input and output port circuit serves to output signals generated within a chip to the outside through an input/output pad or to transfer the signals inputted through the input/output pad to the chip.

Figure 1:
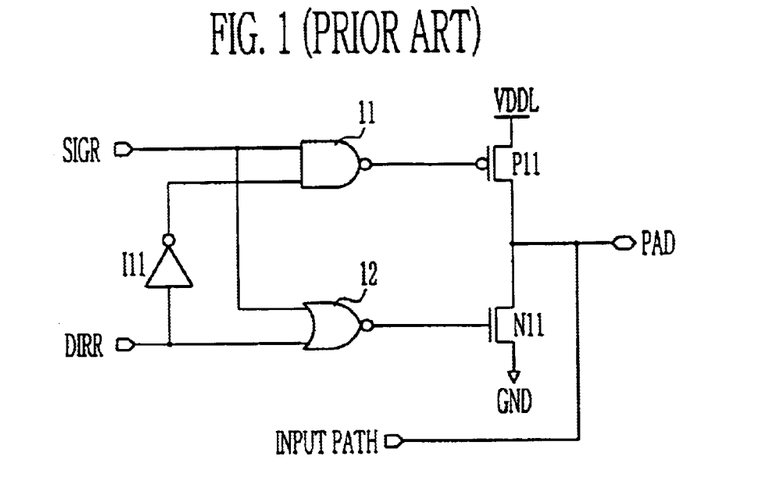
FIG. 1 is a circuit diagram of a conventional input and output port circuit.

Referring now to FIG. 1, a construction of a conventional input and output port circuit will be below described.

A two-input low voltage NAND gate 11 functions to logically combine a value of a signal register (SIGR) and a value of an input/output register (DIRR) that is inverted by an inverter I11. A two-input low voltage NOR gate 12 serves to logically combine the value of the signal register (SIGR) and the value of the input/output register (DIRR). At this time, the signal register (SIGR) stores output signals and the input/output register (DIRR) stores an input/output control signal for determining an input/output direction. A PMOS transistor P11 of a large size is connected between a low voltage (VDDL) output terminal (a logical value "1") and a pad (PAD), thereby being driven depending on the output of the two-input low voltage NAND gate 11. A NMOS transistor N11 is connected between the pad (PAD) and the ground (GND) (a logical value "0") and is also driven depending on the output of the two-input low voltage NOR gate 12. The PMOS transistor P11 and the NMOS transistor N11 are output driving transistors. Meanwhile, all of the circuits are constructed to perform a normal voltage operation.

A method of driving the conventional input and output port circuit constructed above will be described.

If the value of the input/output register (DIRR) is the logical value "1" (VDDL), the two-input low voltage NAND gate 11 outputs the logical value "1" (VDDL) and the two-input low voltage NOR gate 12 outputs the logical value "0", regardless of the value of the signal register (SIGR). Therefore, the input signal is inputted by the input path, since both the transistors P11 and N11 are turned "OFF" by the outputs of the two-input low voltage NAND gate 11 and the two-input low voltage NOR gate 12, respectively.

Meanwhile, if the value of the input/output register (DIRR) is the logical value "0", its output is determined depending on the value of the signal register (SIGR). If the value of the input/output register (DIRR) is the logical value "0" and the value of the signal register (SIGR) is the logical value "1" (VDDL), the two-input low voltage NAND gate 11 outputs the logical value "0" and the two-input low voltage NOR gate 12 also outputs the logical value "0". As a result, the PMOS transistor P11 is turned "ON" and the NMOS transistor N11 is turned "OFF", so that the low voltage (VDDL) is outputted through the pad (PAD).

Further, if the value of the input/output register (DIRR) is the logical value "0" and the value of the signal register (SIGR) is the logical value "0", the two-input low voltage NAND gate 11 outputs the logical value "1" (VDDL) and the two-input low voltage NOR gate 12 also outputs the logical value "1" (VDDL). As a result, the PMOS transistor P11 is turned "OFF" and the NMOS transistor N11 is turned "ON", so that the value of the ground (GND) is outputted through the pad (PAD).

It is required that the output driving transistor of the conventional input and output port circuit be constructed to have a very large size, in order to drive a load of a large capacitance. With this construction, a large amount of power consumption is required. In addition, in order to drive the high voltage, one additional input and output port circuit for use in the high voltage is required since the conventional output driving transistor is driven only at the low voltage.

SUMMARY OF THE INVENTION

The present invention is contrived to solve the above problems and an object of the present invention is to provide an input and output port circuit capable of simultaneously driving a high voltage and a low voltage using a single output driving circuit.

Another object of the present invention is to provide an input and output port circuit in which a single output driving circuit is constructed in a multiple stage and is thus selectively driven by an output control register, thus reducing the power consumption.

In order to accomplish the above object, the input and output port circuit according to the present invention, is characterized in that it comprises a signal register for storing output signals; an input/output register at which input/output control signals for determining an input/output direction are stored, a plurality of control registers, a power supply switch circuit for selectively supplying a low voltage or a high voltage depending on a power mode control signal, a signal direction control circuit connected to the signal register and the input/output register for determining the direction of a signal to be inputted or outputted through an input/output pad depending on a value of the signal register and a value of the input/output register, an output control circuit connected to the signal direction control circuit and the control register and driven depending on a value of the control register and output signals of the signal direction control circuit, and an output driving circuit connected to the output control circuit and the power supply switch circuit for outputting the low voltage, the high voltage or a ground value depending on the output signals of the signal direction control circuit and output signals of the output control circuit.

Furthermore, the input and output port circuit of the present invention comprises a power supply switch circuit for selectively supplying a low voltage or a high voltage depending on a power mode control signal that determines a normal voltage operation mode or a high voltage operation mode, a high voltage NAND gate for logically combining a value of a signal register and a value of an input/output register that is inverted by a first high voltage inverter, a high voltage NOR gate connected to the signal register and the input/output register for logically combining a value of the signal register and the value of the input/output register, a high voltage OR gate for logically combining an output of the high voltage NAND gate and a value of a control register that is inverted by a second high voltage inverter, a high voltage AND gate connected to the high voltage NOR gate and the control register for logically combining an output of the high voltage NOR gate and the value of the control register, and an output driving circuit connected between the power supply switch circuit and the around and constructed with a plurality of output driving circuits, wherein the output driving circuits are driven depending on output signals of the high voltage NAND gate, the high voltage NOR gate, the high voltage OR gate and the high voltage AND gate to output the low voltage, the high voltage or the ground value.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 2:
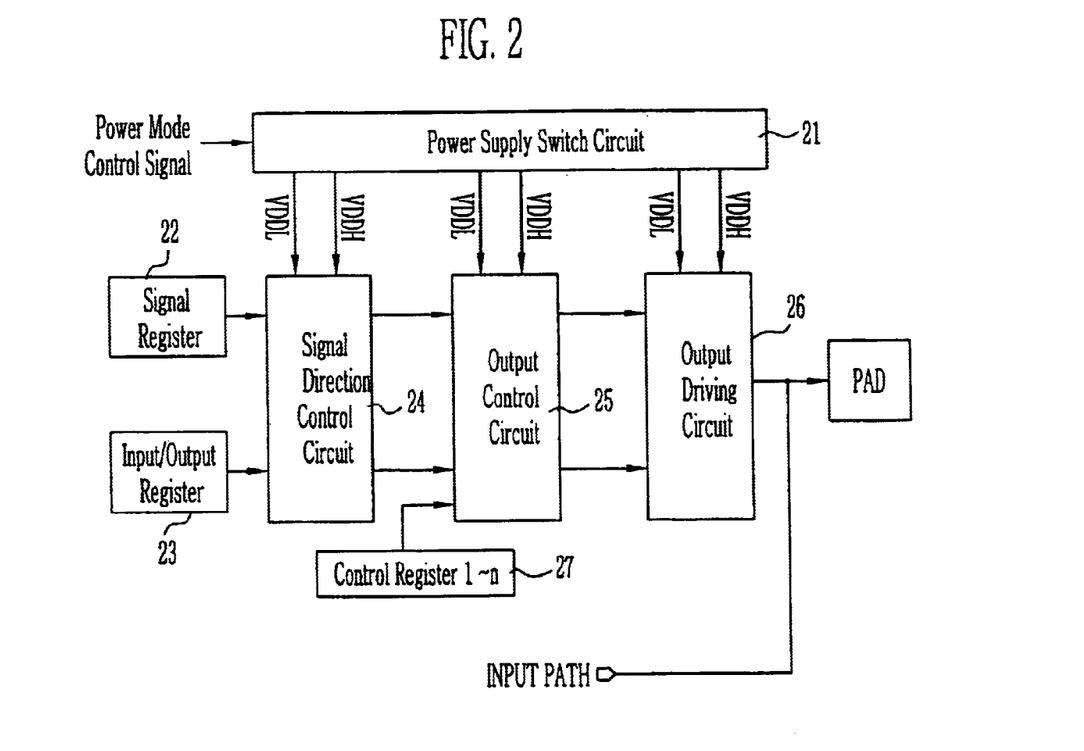
FIG. 2 is a block diagram of an input and output port circuit according to one embodiment of the present invention.

FIG. 2 is a block diagram of an input and output port circuit according to one embodiment of the present invention.

The input and output port circuit of the present invention includes a power supply switch circuit 21, a signal register 22, an input/output register 23, a signal direction control circuit 24, an output control circuit 25 and power transistors. The input and output port circuit further includes an output driving circuit 26 having a plurality of output driving circuits. In the input and output port circuit, a value of the signal register 22, a value of the input/output register 23, values of a plurality of control registers 27, and a power mode control signal (PMCNT) of the power supply switch circuit 21 are all input signals. A low voltage (VDDL), a high voltage (VDDH) and a ground (GND) are the power supply.

The power supply switch circuit 21 is one that supplies the power to the entire circuits. The low voltage (VDDL) or the high voltage (VDDH), which are outputted from the power supply switch circuit 21 by the power mode control signal (PMCNT), is supplied to the entire circuits. The power supply switch circuit 21 has a structure having one output in which a power PMOS transistor driven as the low voltage (VDDL) and a power PMOS transistor driven as the high voltage (VDDH) are added to the two output nodes of a level shift circuit having a common latch structure.

The signal register 22 stores output signals and the input/output register 23 stores an input/output control signal for determining an input/output direction.

The signal direction control circuit 24 for determining the direction of the signals has a two-input high voltage NAND gate, a two-input high voltage NOR gate and a high voltage inverter.

The output control circuit 25 for controlling the output driving circuit 26 having several output driving circuits of a small size selectively turns "ON" and "OFF" the output driving circuit 26 in line with the output load, by means of the plurality of the control registers 27 and several logic gates. At this time, if the load is large, all the output driving circuits 26 are simultaneously turned "ON". On the contrary, if the load is small, only one of the several output driving circuits 26 is turned "ON". Due to this, the power consumption can be minimized. When the number of the control register 27 is N, the number of the output driving circuit 26 of a small size is $2^N$.

The output driving circuit 26 has a power NMOS transistor and a PMOS transistor. Several output driving circuits of a small size constitute a single output driving circuit of a large size.

Figure 3:
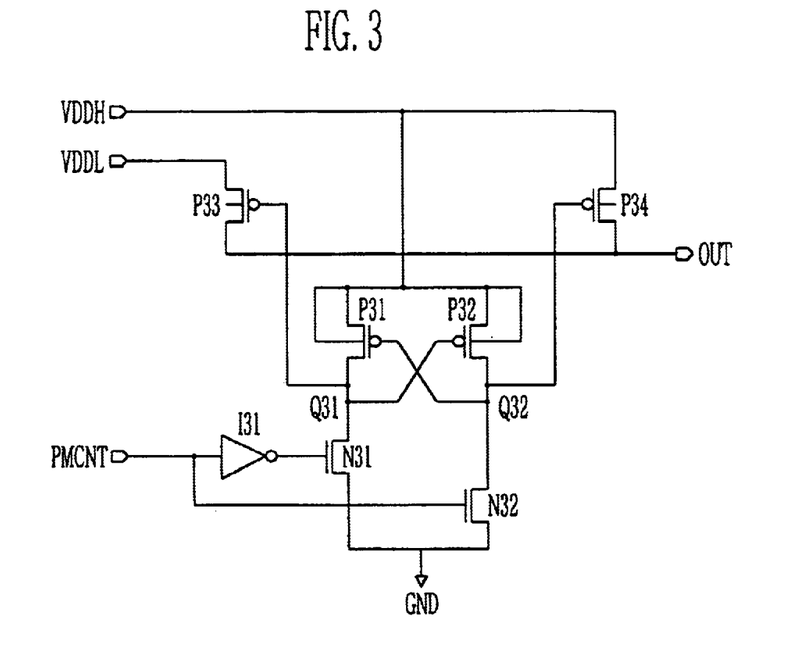
FIG. 3 shows a power supply switch circuit constituting the input and output port circuit according to the present invention.

Referring now to FIG. 3, a construction of a power supply switch circuit constituting the input and output port circuit according to the present invention will be described.

A first PMOS transistor P31 that is driven depending on the potential of a second node Q32 is connected between the high voltage (VDDH) input terminal and a first node Q31. A first NMOS transistor N31 that is driven depending on a signal of a power mode control signal (PMCNT) that is inverted by an inverter I31 is connected between the first node Q31 and the ground (GND). Further, a second PMOS transistor P32 that is driven depending on the potential of the first node Q31 is connected between the high voltage (VDDH) input terminal and the second node Q32. A second NMOS transistor N32 that is driven depending on the power mode control signal (PMCNT) is connected between the second node Q32 and the ground (GND). Meanwhile, a third PMOS transistor P33 that is driven depending on the potential of the first node Q31 is connected between the low voltage (VDDL) input terminal and the output terminal (OUT). A fourth PMOS transistor P34 that is driven depending on the potential of the second node Q32 is connected between the high voltage (VDDH) input terminal and the output terminal (OUT).

At this time, the first and second PMOS transistors P31 and P32 are power transistors in which a substrate is connected to a source terminal, and the third and fourth PMOS transistors P33 and P34 are power transistors in which the substrate is floated.

A method of driving the power supply switch circuit constructed above will be now described.

If the power mode control signal (PMCNT) is applied as a logical value "0", the second NMOS transistor N32 is turned "OFF". Also, the power mode control signal (PMCNT) applied as the logical value "0" is inverted to the logical value "1" through the inverter I31 and the first NMOS transistor N31 is accordingly turned "ON". Therefore, the first node Q31 thus keeps a state of "0", and the second and third PMOS transistors P32 and P33 are accordingly turned "ON". As a result, the second node Q32 keeps a state of "1" (VDDH), and the low voltage (VDDL) is outputted to the output terminal (OUT) through the third PMOS transistor P33.

If the power mode control signal (PMCNT) is applied as a logical value "1" (VDDL), the second NMOS transistor N32 is turned "ON". Also, the power mode control signal (PMCNT) applied as the logical value "1" (VDDL) is inverted to the logical value "0" through the inverter I31 and the first NMOS transistor N31 is accordingly turned "OFF". Therefore, the second node Q32 keeps a state of "0" and the first and fourth PMOS transistors P31 and P34 are accordingly turned "ON". As a result, the first node Q31 keeps the state of "1" (VDDH), and the high voltage (VDDH) is outputted to the output terminal (OUT) through the fourth PMOS transistor P34.

As described above, the power supply switch circuit of the present invention selectively outputs the low voltage (VDDL) or the high voltage (VDDH) by means of the power mode control signal (PMCNT). If the power mode control signal (PMCNT) is applied as the logical value "0",' the power supply switch circuit outputs the low voltage (VDDL). On the other hand, if the power mode control signal (PMCNT) is applied as the logical value "1" (VDDL), it outputs the high voltage (VDDH).

Figure 4A:
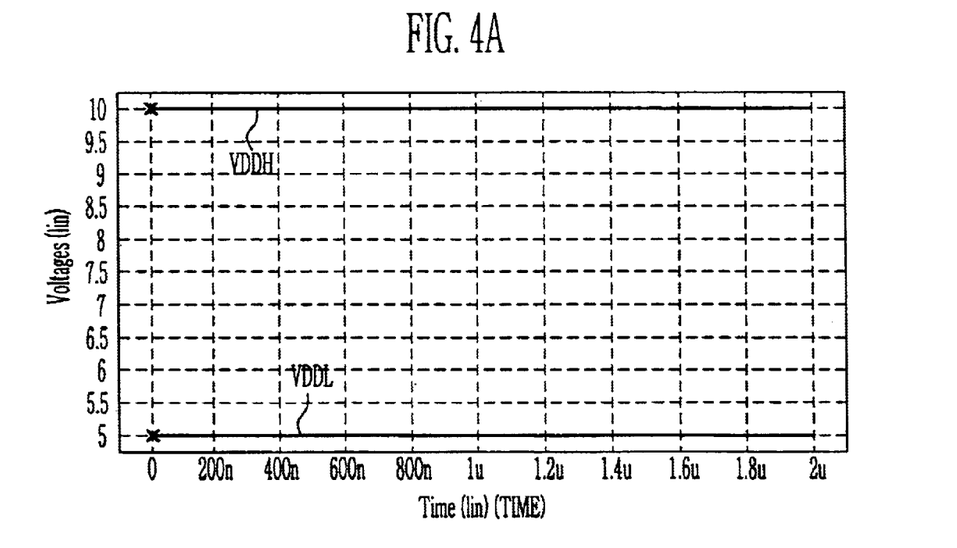
FIG. 4A~FIG. 4C illustrate simulation results of the power supply switch circuit according to the present invention.
Figure 4B:
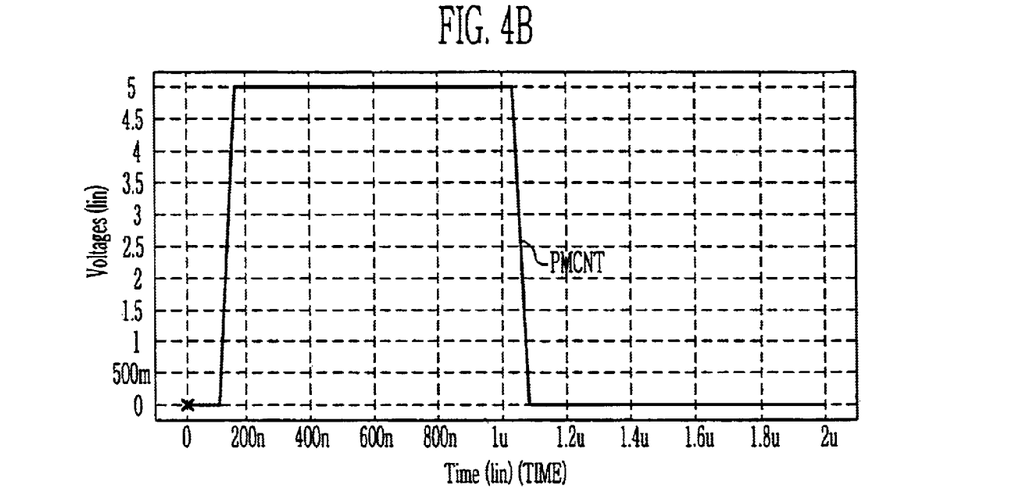
Figure 4C:
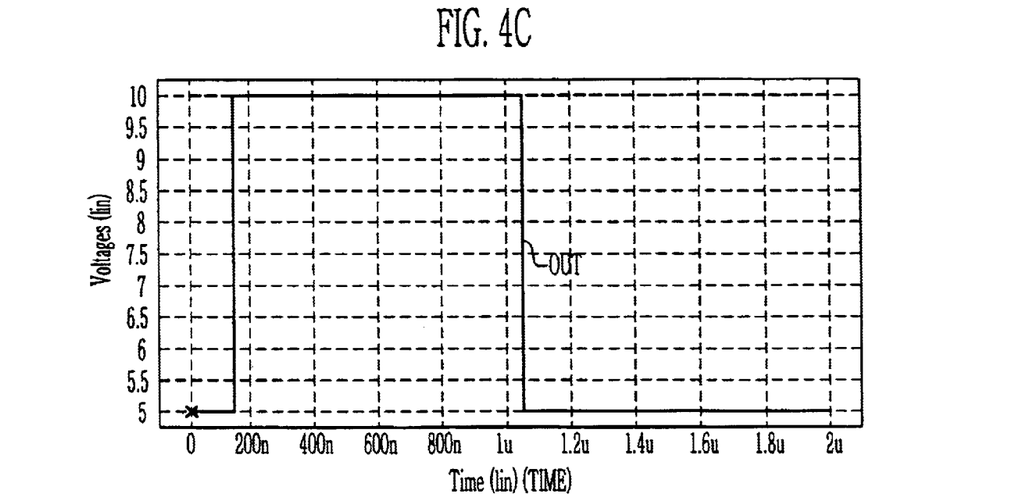

FIG. 4A~FIG. 4C illustrate simulation results of the power supply switch circuit according to the present invention, wherein FIG. 4A shows a state that the low voltage (VDDL) of 5V is applied and the high voltage (VDDH) of 10V is applied, FIG. 4B shows a waveform of the power mode control signal (PMCNT), and FIG. 4C shows the potential of the output terminal depending on the power mode control signal. The simulation results show that if the power mode control signal is the logical value "0", the output becomes the low voltage (VDDL) and if it is the logical value "1" (VDDL), the output becomes the high voltage (VDDH).

An operation of the input and output port circuit according to the present invention includes mainly two functions: the first function is a normal voltage operation mode function and the second function is a high voltage operation mode function.

In the normal voltage operation mode, the power supply switch circuit 21 outputs the low voltage (VDDL) since the power mode control signal (PMCNT) is the logical value "0". Therefore, the powers of all the blocks of the present invention become the low voltage (VDDL). If the value of the input/output register 23 is the logical value "1" (VDDL), the input signal is inputted by the input path regardless of the signal register 22 since all of the several power NMOS and PMOS transistors of a small size constituting the output driving circuit 26 are turned "OFF". Meanwhile, if the value of the input/output register 23 is the logical value "0", its output is decided by the value of the signal register 22. If the value of the signal register 22 is the logical value "1" (VDDL), the power PMOS transistor constituting the output driving circuit 26 is turned "ON". Due to this, "VDDL" is outputted through the pad (PAD). On the other hand, if the value of the signal register 22 is the logical value "0", the power NMOS transistor constituting the output driving circuit 26 is turned "ON". Due to this, "GND" being the value of the signal register is outputted through the pad (PAD). Thus, the output level is "GND" to "VDDL".

In the high voltage operation mode, the output of the power supply switch circuit 21 is the high voltage (VDDH) since the power mode control signal (PMCNT) is the logical value "1". The powers of all the blocks of the present invention thus become the high voltage (VDDH). If the value of the input/output register 23 is the logical value "1" (VDDH), the input signal is inputted by the input path regardless of the signal register 22 since all of the several power NMOS and PMOS transistors of a small size constituting the output driving circuit 26 are turned "OFF". On the other hand, if the value of the input/output register 23 is the logical value "0", its output is decided by the value of the signal register 22. If the value of the signal register 22 is the logical value "1" (VDDH), the power PMOS transistor constituting the output driving circuit 26 is turned "ON", so that "VDDH" is outputted through the pad (PAD) if the value of the signal register 22 is the logical value "0", the power NMOS transistor constituting the output driving circuit 26 is turned "ON", so that "GND" being the value of the signal register 22 is outputted through the pad (PAD). Thus, the output level is "GND" to "VDDH".

A detailed operation of driving the input and output port circuit according to the present invention, which performs the two functional operations, will be described by reference to FIG. 5 relating to the two-stage input and output port circuit.

Figure 5:
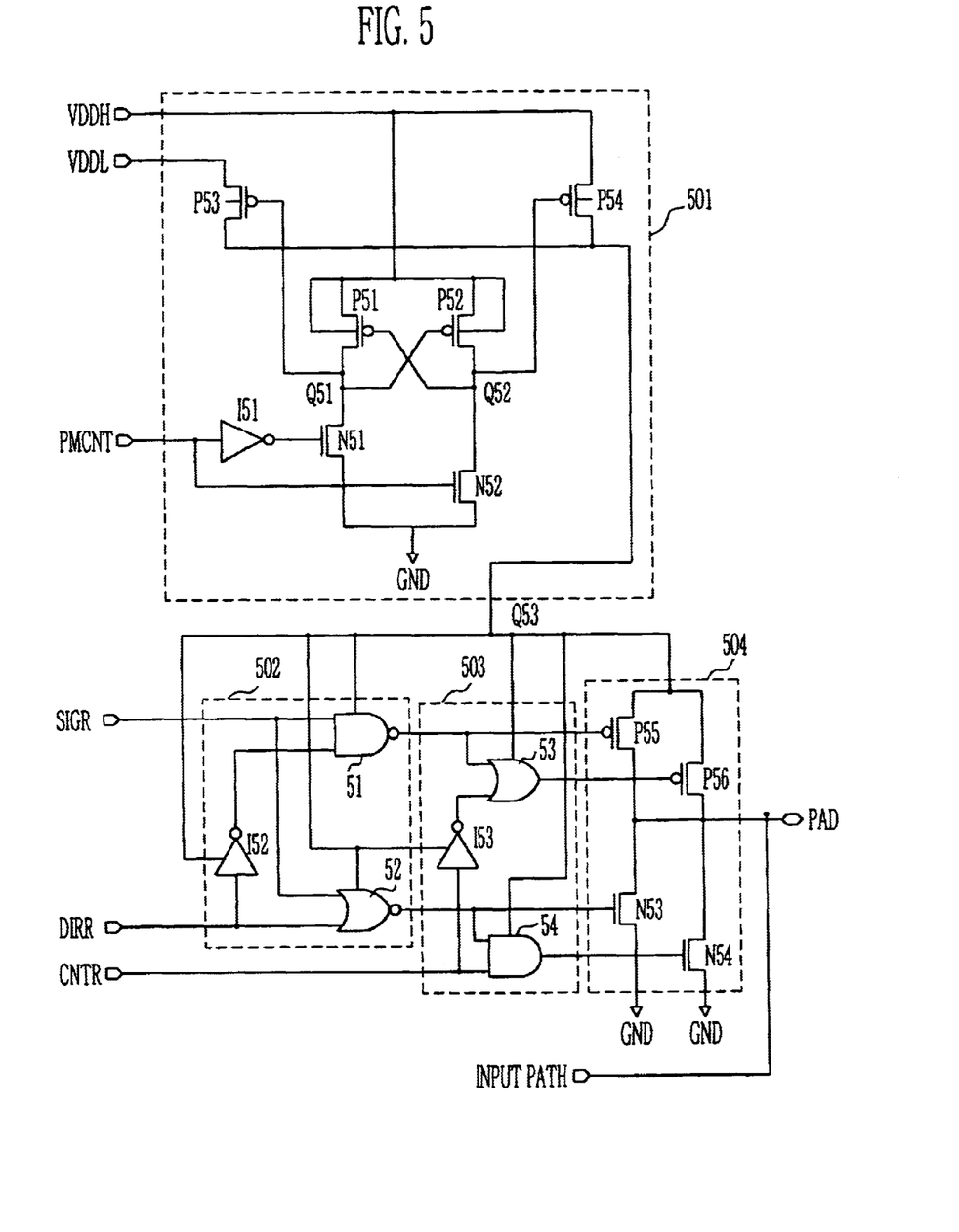
FIG. 5 shows a two-stage input and output port circuit according to another embodiment of the present invention.

Referring now to FIG. 5, a construction of a two-stage input and output port circuit according to another embodiment of the present invention will be below described.

A construction of a power supply switch circuit 501 will be first described. A first PMOS transistor P51 that is driven depending on the potential of a second node Q52 is connected between a high voltage (VDDH) input terminal and a first node Q51. A first NMOS transistor N51, that is driven depending on a signal of the power mode control signal (PMCNT) that is inverted by the first inverter I51, is connected between the first node Q51 and a ground (GND). Further, a second PMOS transistor P52 that is driven depending on the potential of the first node Q51 is connected between the high voltage (VDDH) input terminal and the second node Q52. A second NMOS transistor N52 that is driven depending on the power mode control signal (PMCNT) is connected between the second node Q52 and the ground (GND). On the other hand, a third PMOS transistor P53 that is driven depending on the potential of the first node Q51 is connected between the low voltage (VDDL) input terminal and a third node Q53. A fourth PMOS transistor P54 that is driven depending on the potential of the second node Q52 is also connected between the high voltage (VDDH) input terminal and the third node Q53. At this time, the first and second PMOS transistors P51 and P52 are power transistors in which a substrate is connected to a source terminal. The third and fourth PMOS transistors P53 and P54 are power transistors in which the substrate is floated.

A construction of a signal direction control circuit 502 will be described. A high voltage NAND gate 51 logically combines a value of the signal register (SIGR) and a value of an input/output register (DIRR) that is inverted by the second high voltage inverter 152. The high voltage NOR gate 52 logically combines the value of the signal register (SIGR) and the value of the input/output register (DIRR). The output values of the high voltage NAND gate 51, the high voltage NOR gate 52 and the second high voltage inverter I52 are the low voltage (VDDL) or the ground (GND) in the normal voltage operation mode, and the output values are the high voltage (VDDH) or the ground (GND) in the high voltage operation mode.

A construction of an output control circuit 503 will be now described.

A high voltage OR gate 53 logically combines the output signal of the high voltage NAND gate 51 in the signal direction control circuit 502 and the value of the control register CNTR that is inverted through the third high voltage inverter I53. A high voltage AND gate 54 logically combines the output signal of the high voltage NOR gate 51 in the signal direction control circuit 502 and the value of the control register CNTR. At this time, the output values of the high voltage OR gate 53, the high voltage AND gate 54 and the third high voltage inverter I53 are the low voltage (VDDL) or the ground (GND) in the normal voltage operation mode, and the high voltage (VDDH) or the ground (GND) in the high voltage operation mode.

A construction of an output driving circuit 504 that is constructed in a two-stage will be now described.

A fifth power PMOS transistor P55 is connected between the third node Q53 and the pad (PAD) and is driven depending on the output signal of the high voltage NAND gate 51 in the signal direction control circuit 502. A sixth power PMOS transistor P56 is connected between the third node Q53 and the pad (PAD) and is driven on the output signal of the high voltage OR gate 53 in the output control circuit 503. A third power NMOS transistor N53 is connected between the pad (PAD) and the ground (GND) and is driven depending on the output signal of the high voltage NOR gate 52 in the signal direction control circuit 502. Further, a fourth power NMOS transistor N54 is connected between the pad (PAD) and the ground (GND) and is driven depending on the output signal of the high voltage AND gate 54 in the output control circuit 503.

A method of driving the input and output port circuit constructed above will be now described.

The power supply switch circuit outputs the low voltage (VDDL) in the normal voltage operation mode in which the power mode control signal (PMCNT) is applied as the logical value "0", and also outputs the high voltage (VDDH) in the high voltage operation mode in which the power mode control signal (PMCNT) is applied as the logical value "1" (VDDL), as described by reference to FIG. 3.

As described above, in the normal voltage operation mode, if the control register CNTR is the logical value "0" and the input/output register (DIRR) is the logical value "1" (VDDL), the input signal is inputted by the input path regardless of the logical value of the signal register (SIGR) since the fifth power PMOS P55 and the third power NMOS N53 in output driving circuit 504 are turned "OFF".

In the normal voltage operation mode in which the power mode control signal (PMCNT) is applied as the logical value "0", if the control register CNTR is the logical value "0", the input/output register (DIRR) is the logical value "0" and the logical value of the signal register (SIGR) is "0", the high voltage NAND gate 51 outputs the logical value "1" (VDDL) and the high voltage NOR gate 52 outputs the logical value "1" (VDDL). Therefore, the fifth power PMOS transistor P55 is turned "OFF" and the third power NMOS transistor N53 is turned "ON", so that "GND" being the value of the signal register (SIGR) is outputted through the pad (PAD). On the other hand, in the normal operation mode in which the power mode control signal (PMCNT) is applied as the logical value "0", if the control register CNTR is the logical value "0", the input/output register (DIRR) is the logical value "0" and the signal register (SIGR) is the logical value "1" (VDDL), the first high voltage NAND gate 51 outputs the logical value "0" and the high voltage NOR gate 52 outputs the logical value "0". Therefore, the fifth power PMOS transistor P55 is turned "ON" and the third power NMOS transistor N53 is turned "OFF", so that "VDDL" being the value of the signal register (SIGR) is outputted through the pad (PAD).

As described, in the normal voltage operation mode, if the input/output register (DIRR) is the logical value "0", the control register CNTR is the logical value "0" and the signal register (SIGR) is the logical value "0", "GND" is outputted through the pad (PAD). If the signal register (SIGR) is the logical value "1" (VDDL), "VDDL" is outputted through the pad (PAD).

In the high voltage operation mode in which the power mode control signal (PMCNT) is applied as the logical value "1" (VDDL), if the input/output register (DIRR) is the logical value "1" (VDDH), the control register CNTR is the logical value "0" and the logical value of the signal register (SIGR) is "0", the high voltage NAND gate 51 outputs the logical value "1" (VDDH) and the high voltage NOR gate 52 outputs the logical value "0". Therefore, the input signal is inputted by the input path since the fifth power PMOS P55 and the third power NMOS N53 are turned "OFF". On the other hand, in the high voltage operation mode in which the power mode control signal (PMCNT) is applied as the logical value "1" (VDDL), if the input/output register (DIRR) is the logical value "1" (VDDH), the control register CNTR is the logical value "0" and the signal register (SIGR) is the logical value "1" (VDDH), the high voltage NAND gate 51 outputs the logical value "1" (VDDH) and the high voltage NOR gate 52 outputs the logical value "0". Therefore, the input signal is inputted by the input path since the fifth power PMOS P55 and the third power NMOS N53 are turned "OFF".

As described, in the high voltage operation mode, if the control register CNTR is the logical value "0" and the input/output register (DIRR) is the logical value "1" (VDDH), the input signal is inputted by the input path regardless of the logical value of the signal register (SIGR) since the fifth power PMOS P55 and the third power NMOS N53 in output driving circuit 504 are turned "OFF".

In the high voltage operation mode in which the power mode control signal (PMCNT) is applied as the logical value "1" (VDDL), if the input/output register (DIRR) is the logical value "0", the control register CNTR is the logical value "0" and the logical value of the signal register (SIGR) is "0", the high voltage NAND gate 51 outputs the logical value "1" (VDDH) and the high voltage NOR gate 52 outputs the logical value "1" (VDDH). Therefore, the fifth power PMOS transistor P55 is turned "OFF" and the third power NMOS transistor N53 is turned "ON", so that "GND" being the value of the signal register (SIGR) is outputted through the pad (PAD). On the other hand, in the high voltage operation mode in which the power mode control signal (PMCNT) is applied as the logical value "1" (VDDL), if the input/output register (DIRR) is the logical value "0" and the signal register (SIGR) is the logical value "1" (VDDH), the high voltage NAND gate 51 outputs the logical value "0" and the high voltage NOR gate 52 outputs the logical value "0". Therefore, the fifth power PMOS transistor P55 is turned "ON" and the third power NMOS transistor N53 is turned "OFF", so that "VDDH" being the value of the signal register (SIGR) is outputted through the pad (PAD).

As above, in the high voltage operation mode, if the control register CNTR is the logical value "0", the input/output register (DIRR) is the logical value "0" and the signal register (SIGR) is the logical value "0", "GND" is outputted through the pad (PAD). On the other hand, if the signal register (SIGR) is the logical value "1" (VDDH), "VDDH" is outputted through the pad (PAD).

In the above circuit operation, however, if the value of the control register CNTR is the logical value "0", only one stage of the output driving circuit 504 that is constructed in two stages is driven. If the value of the control register CNTR is the logical value "1" (VDDL or VDDH), both the output driving circuits 504 of the two stages are driven. As such, if there are N of the control registers, $2^N$ of stages are required, and the output control circuit requires $2^N$ of N+1 input high voltage AND gates, $2^N$ of N+1 input high voltage OR gates and N of the high voltage inverters are required.

Figure 6A:
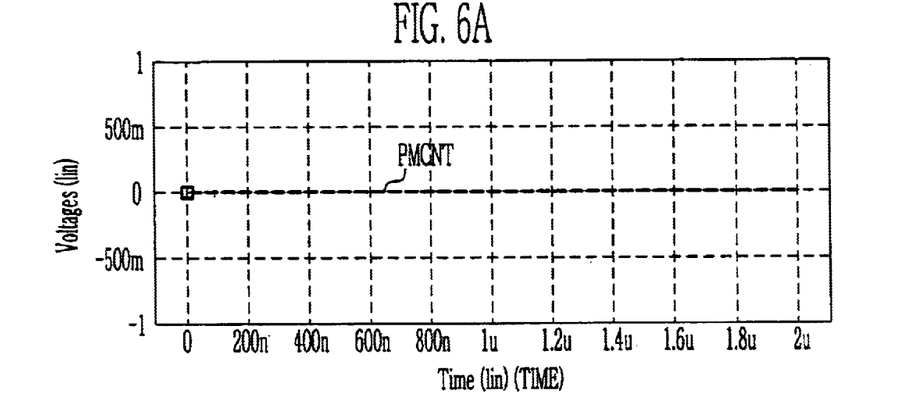
FIG. 6A~FIG. 6C illustrate simulation results of a normal voltage operation mode in the two-stage input and output port circuit according to an embodiment of the present invention.
Figure 6B:
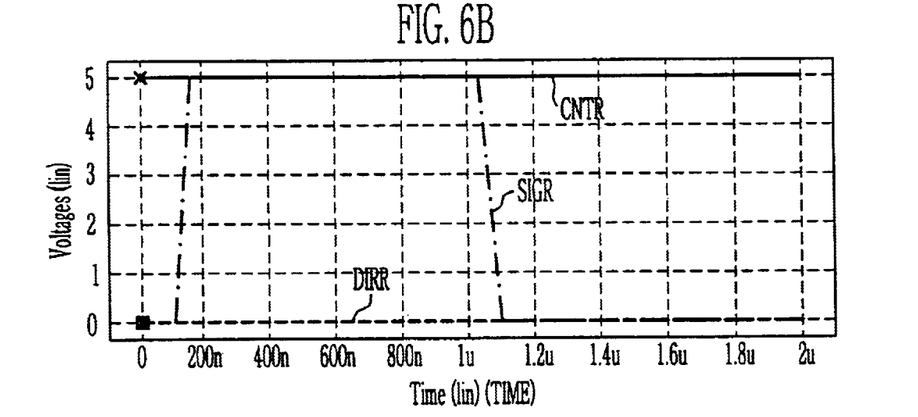
Figure 6C:
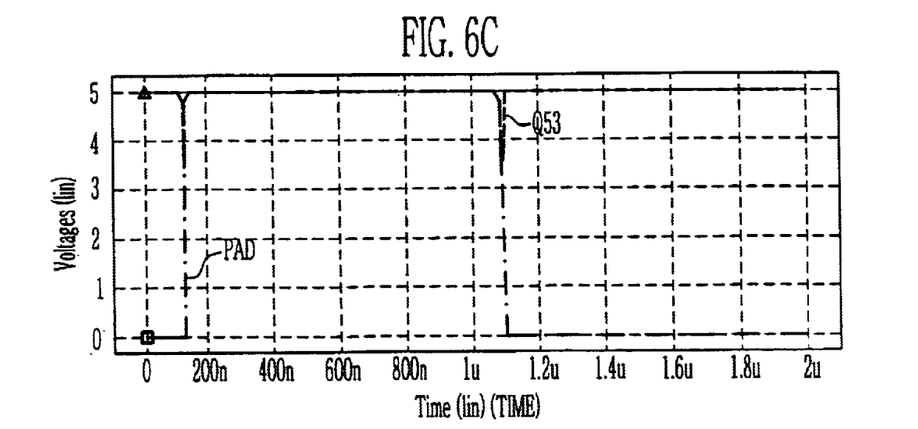

FIG. 6A~FIG. 6C illustrate simulation results in the normal voltage operation mode in the two-stage input and output port circuit according to the embodiment of the present invention.

If the power mode control signal (PMCNT) is inputted as the logical value "0" 0V as shown in FIG. 6A, the power supply switch circuit supplies a power of "VDDL" 5V as shown in FIG. 6C. Also, the output of the pad (PAD) is changed to "GND" 0V or "VDDL" 5V, as shown in FIG. 6C, depending on the value of the signal register (SIGR) among the logical values of the input/output register (DIRR), the signal register (SIGR) and the control register CNTR, which are applied to the input and output port circuit, as shown in FIG. 6B.

Figure 7A:
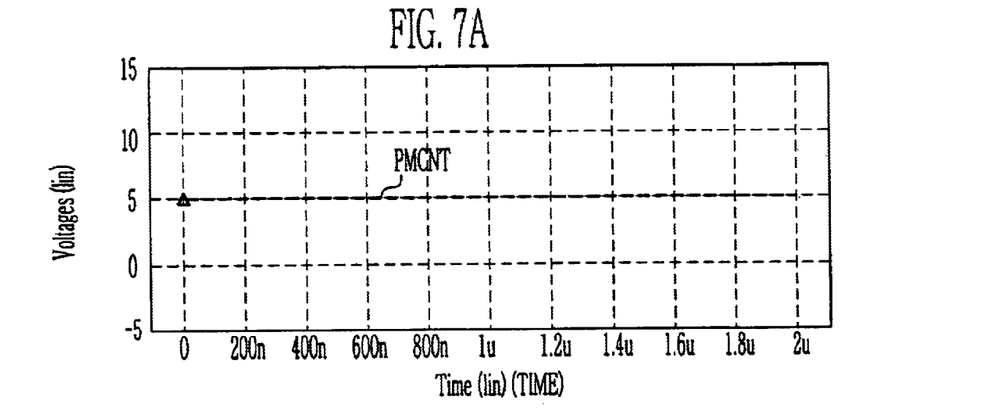
FIG. 7A~FIG. 7C illustrate simulation results of a high voltage operation mode in the two-stage input and output port circuit according to an embodiment of the present invention.
Figure 7B:
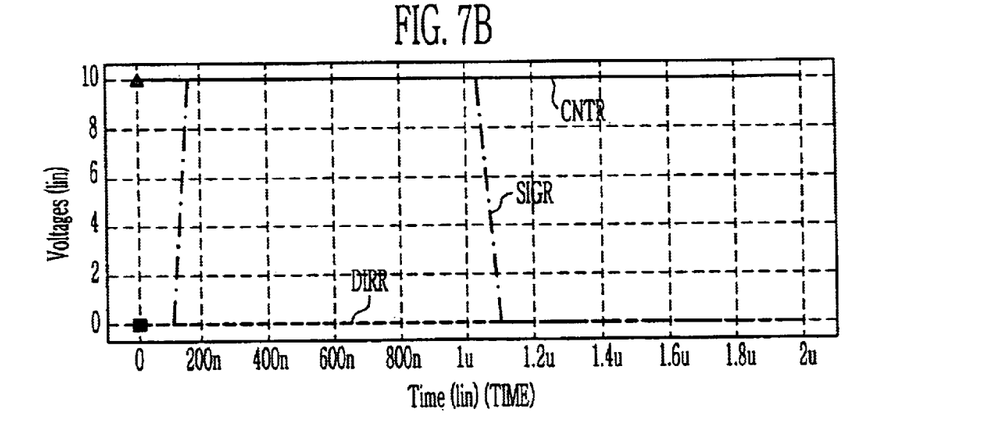
Figure 7C:
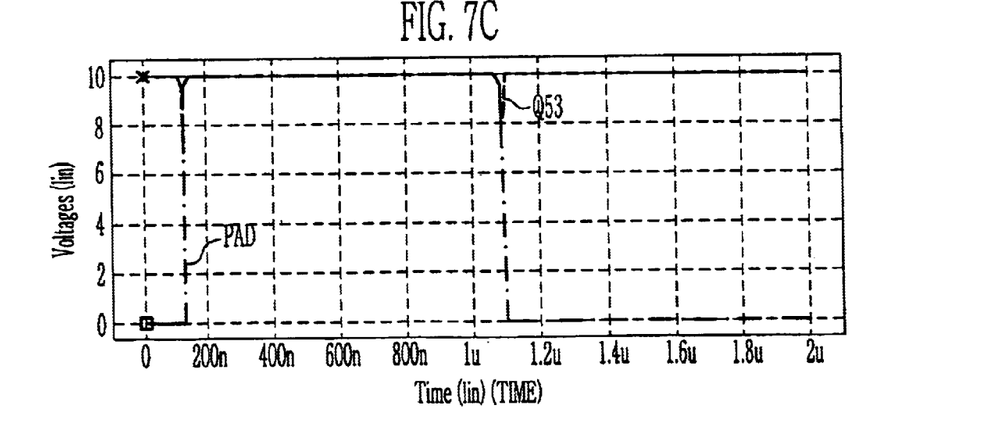

FIG. 7A~FIG. 7C illustrate simulation results of the high voltage operation mode in the two-stage input and output port circuit according to an embodiment of the present invention.

If the power mode control signal (PMCNT) is inputted as the logical value "1" 5V as shown FIG. 7A, the power supply switch circuit supplies a voltage of "VDDH" 10V as shown FIG. 7C.

Also, the output of the pad (PAD) is changed to "GND" 0V or "VDDL" 10V, as shown in FIG. 7C, depending on the value of the signal register (SIGR) among the logical values of the input/output register (DIRR), the signal register (SIGR) and the control register CNTR, which are applied to the input and output port circuit, as shown in FIG. 7B.

As mentioned above, according to the present invention, the high voltage (VDDH) and the low voltage (VDDL) can be simultaneously driven using only a single output driving circuit by means of the power mode control signal (PMCNT). Therefore, the present invention has an outstanding advantage that it can implement various input and output port circuits. Further, a single output driving circuit is constructed in multiple stages and is selectively driven by the output control register. Therefore, the present invention has an advantage that it can save the power consumption.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. An input and output port circuit, comprising:
a signal register for storing output signals;
an input/output register at which input/output control signals for determining an input/output direction are stored;
a plurality of control registers;
a power supply switch circuit for selectively supplying a low voltage or a high voltage depending on a power mode control signal;
a signal direction control circuit connected to the signal register and the input/output register for determining the direction of a signal to be inputted or outputted through an input/output pad depending on a value of the signal register and a value of the input/output register;
an output control circuit connected to the signal direction control circuit and the control register and driven depending on a value of the control register and output signals of the signal direction control circuit; and
an output driving circuit connected to the output control circuit and the power supply switch circuit for outputting the low voltage, the high voltage or a ground value depending on the output signals of the signal direction control circuit and output signals of the output control circuit.

2. The input and output port circuit as claimed in claim 1, wherein the power supply switch circuit comprises:
a first power NMOS transistor connected between a first node and a ground terminal and driven depending on an inverted signal of the power mode control signal;
a second power NMOS transistor connected between a second node and the ground terminal and driven depending on the power mode control signal;
a first power PMOS transistor connected between the high voltage input terminal and the first node and driven depending on the potential of the second node;
a second power PMOS transistor connected between the high voltage input terminal and the second node and driven depending on the potential of the first node;
a third power PMOS transistor connected between the low voltage input terminal and the output terminal and driven depending on the potential of the first node; and
a fourth power PMOS transistor connected between the high voltage input terminal and the output terminal and driven depending on the potential of the second node.

3. The input and output port circuit as claimed in claim 1, wherein the signal direction control circuit comprises:
a high voltage inverter for inverting a value of the input/output register;
a high voltage NAND gate connected to the signal register and the high voltage inverter for outputting the high voltage, the low voltage or the ground value depending on a value of the signal register and a value of the input/output register that is inverted through the high voltage inverter; and
a high voltage NOR gate connected to the signal register and the input/output register for outputting the high voltage, the low voltage or the ground value depending on the value of the signal register and the value of the input/output register.

4. The input and output port circuit as claimed in claim 3, wherein the output control circuit comprises:
a high voltage inverter that is increased in proportion to the number of the control register, for inverting the value of the control register;
a high voltage OR gate that is exponentially increased depending on the number of the control register, for outputting the high voltage, the low voltage or the ground value depending on the an output of the high voltage NAND gate constituting the output direction control circuit and the value of the control register inverted through the high voltage inverter; and
a high voltage AND gate that is exponentially increased depending on the number of the control register, for outputting the high voltage, the low voltage or the ground value depending on an output of the high voltage NOR gate constituting the output direction control circuit and the value of the control register.

5. The input and output port circuit as claimed in claim 1, wherein the output control circuit comprises:

a high voltage inverter that is increased in proportion to the number of the control register, for inverting the value of the control register;

a high voltage OR gate that is exponentially increased depending on the number of the control register, for outputting the high voltage, the low voltage or the ground value depending on the an output of the high voltage NAND gate constituting the output direction control circuit and the value of the control register inverted through the high voltage inverter; and a high voltage AND gate that is exponentially increased depending on the number of the control register, for outputting the high voltage, the low voltage or the ground value depending on an output of the high voltage NOR gate constituting the output direction control circuit and the value of the control register.

6. The input and output port circuit as claimed in claim 1, wherein the output driving circuit comprises:

a first output driving circuit connected between the power supply switch circuit and the ground and driven depending on the output signals of the signal direction control circuit; and a second output driving circuits connected between the power supply switch circuit and the ground and driven depending on the output signals of the output control circuit, wherein the number of the second output driving circuits is exponentially increased depending on the number of the control register.

7. An input and output port circuit, comprising:

a power supply switch circuit for selectively supplying a low voltage or a high voltage depending on a power mode control signal for determining a normal voltage operation mode or a high voltage operation mode;

a high voltage NAND gate for logically combining a value of a signal register and a value of an input/output register that is inverted by a first high voltage inverter;

a high voltage NOR gate connected to the signal register and the input/output register for logically combining a value of the signal register and the value of the input/output register;

a high voltage OR gate for logically combining an output of the high voltage NAND gate and a value of a control register that is inverted by a second high voltage inverter;

a high voltage AND gate connected to the high voltage NOR gate and the control register for logically combining an output of the high voltage NOR gate and the value of the control register; and an output driving circuit having a first and second stage, the output driving circuit connected between the power supply switch circuit and the ground, wherein the first and second stage are driven depending on output signals of the high voltage NAND gate, the high voltage NOR gate, the high voltage OR gate, and the high voltage AND gate to output the low voltage, the high voltage, or the ground value.

8. The input and output port circuit as claimed in claim 7, wherein one stage of the output driving circuit is driven when the value of the control register is logical value "0", and two stages of the output driving circuit are driven when the value of the control register is logical value "1".

9. The input and output port circuit as claimed in claim 7, wherein the output control circuit further comprises 2N of N+1 input high voltage AND gates, 2N of N+1 input high voltage OR gates, and N of high voltage inverters when N of the control registers are further included.

* * * * *